United States Patent [19]

Suzuki

[11] Patent Number: 4,954,721

[45] Date of Patent: Sep. 4, 1990

[54] APPARATUS FOR DETECTING AN ARRAY OF WAFERS

[75] Inventor: Fujio Suzuki, Shiroyama, Japan

[73] Assignee: Tel Sagami Limited, Kanagawa, Japan

[21] Appl. No.: 330,214

[22] Filed: Mar. 29, 1989

[30] Foreign Application Priority Data

Mar. 30, 1988 [JP] Japan .................................. 63-76968

[51] Int. Cl.$^5$ ........................................... G01N 21/86
[52] U.S. Cl. .................................... 250/561; 414/331
[58] Field of Search ................... 250/561, 222.2, 221, 250/223 R; 414/331

[56] References Cited

U.S. PATENT DOCUMENTS 4,803,373 2/1989 Imamura et al. ..................... 250/561
4,892,455 1/1990 Hine ..................................... 414/331

FOREIGN PATENT DOCUMENTS 61-155341 4/1986 Japan .
61-127639 8/1986 Japan .
61-129340 8/1986 Japan .
61-153345 9/1986 Japan .

Primary Examiner—David C. Nelms
Attorney, Agent, or Firm—Oblon, Spivak, McClelland, Maier & Neustadt

[57] ABSTRACT

An apparatus for detecting an array of wafers comprises a reference information generator for generating reference information from the reference condition in which wafers are partly inserted correctly in all grooves formed in side plates of a first wafer carrier, a window setting device for setting wafer-detecting windows at those positions where the wafers are arranged on a second wafer carrier, in accordance with the reference information supplied from said reference information generator, a photosensor for detecting the wafers arranged on the second wafer carrier and generating information representing the presence of the wafers on the second wafer carrier, a signal generator for generating signals from the information generated by the photosensor, and a position detector for collating the signals supplied from the signal generator with said wafer detecting windows, to detect the shape of that portion of any signal that corresponds to a wafer window, and to determine the position of the wafer from the shape of said portion of the signal.

11 Claims, 4 Drawing Sheets

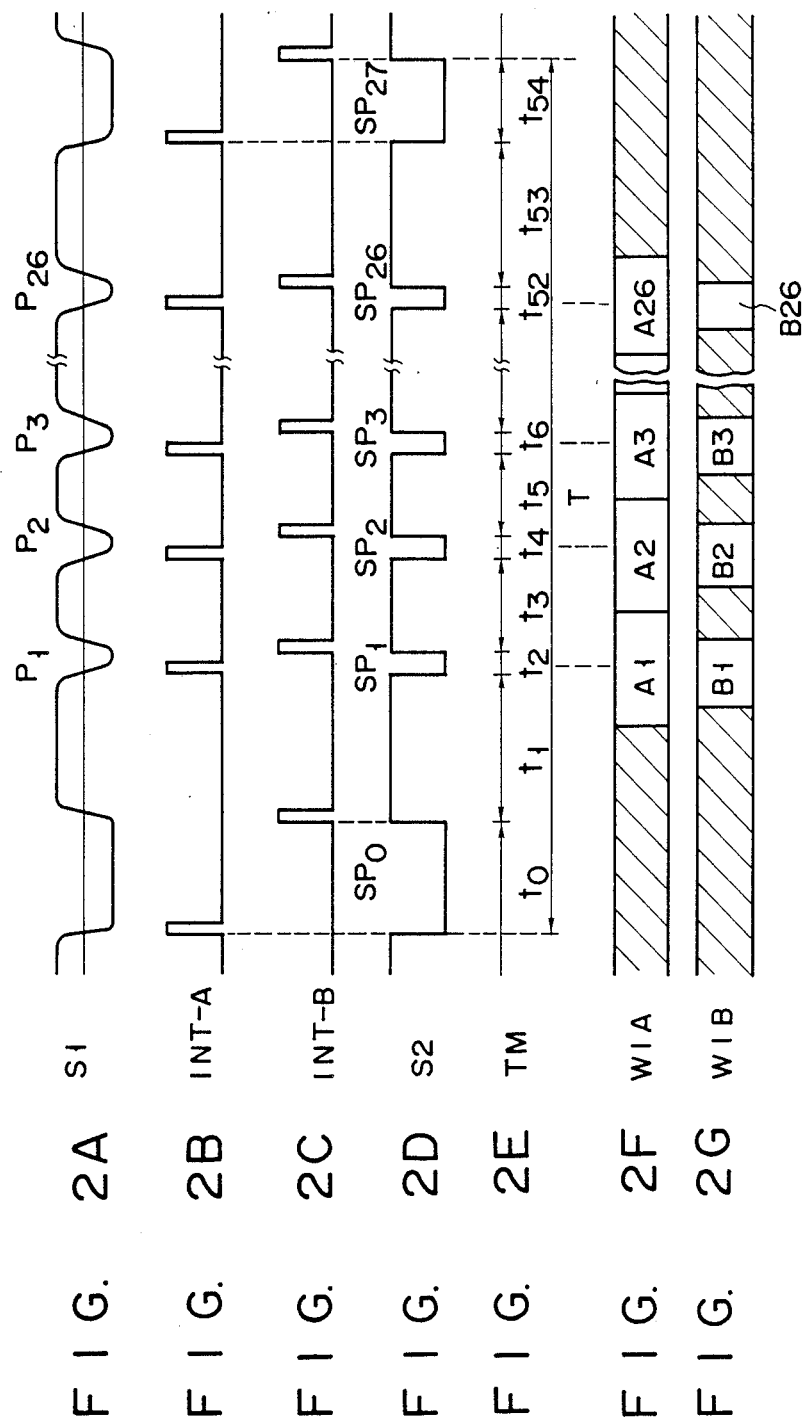

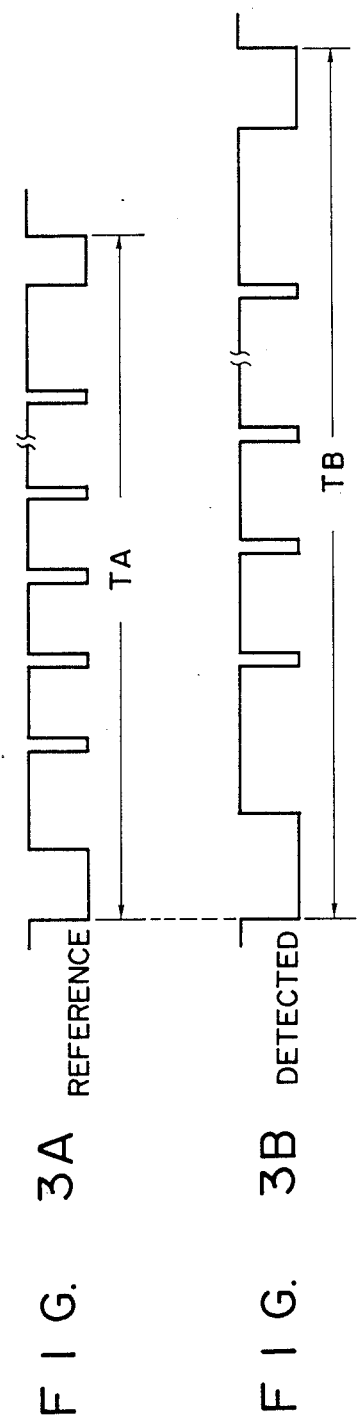

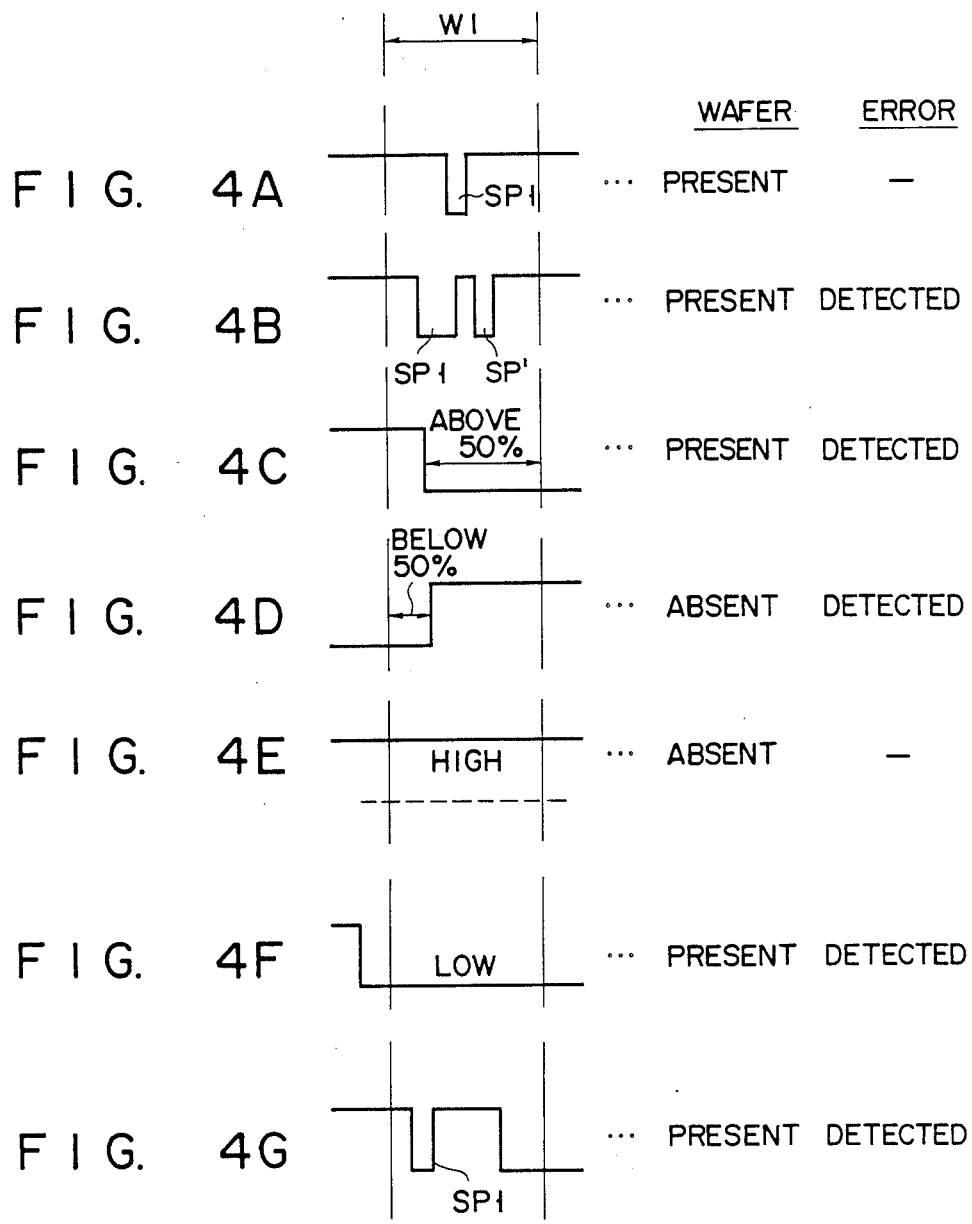

APPARATUS FOR DETECTING AN ARRAY OF WAFERS

BACKGROUND OF THE INVENTION

1. Field of the Invention

The present invention relates to an apparatus for detecting whether or not wafers are exactly mounted as previously determined, on a wafer carrier.

2. Description of the Related Art

Semiconductor wafers mounted on a wafer carrier are usually carried from one place where a process is conducted to another place where another process is done in the course of manufacturing semiconductor integrated circuits. Each of these wafers, for example 26 pieces, is mounted on the wafer carrier, partly inserted in a pair of grooves on the wafer carrier which are formed at a predetermined interval in the longitudinal direction of the wafer carrier. The wafer counter is used in the course of manufacturing semiconductor integrated circuits to check up every lot of wafer carriers, for the number of wafers mounted on each wafer carrier and the presence or absence of a wafer in each pair of the grooves.

Japanese Utility Model Disclosure No. Sho 61-129340 proposes a wafer counter of this type. This wafer counter has light emitting and receiving elements which are intermittently moved in the longitudinal direction of the wafer carrier at such a pitch that is same as the pitch of the wafers arranged on the wafer carrier, and the optical axis of infrared rays between these light emitting and receiving elements is inclined to the axis of the wafers arranged on the wafer carrier which are to be located between the light emitting and receiving elements. When the infrared rays are shielded by a wafer and the quantity of light received by the light receiving element is thus reduced, it is detected that the wafer is present in its corresponding grooves on the wafer carrier and when the quantity of light is not reduced, it is detected that no wafer is present in the grooves. This process of detecting the presence or absence of a wafer is intermittently carried out at the same pitch as that of wafers arranged on the wafer carrier to detect the number of wafers mounted on the wafer carrier.

In the case of this conventional device, however, there is a fear that no exact detection can be attained relating to the number of wafers mounted on the wafer carrier and a position of a pair of grooves where wafer is absent, due to a miss-detection of the light receiving element resulting from fouling of wafers in the course of processing wafers. The conventional device can detect how many wafers are not present on the wafer carrier, but it cannot exactly detect the state of each of them when two wafers inserted in a pair of grooves and when one of wafers seats tilting in its corresponding grooves.

Japanese Utility Model Disclosure No. Sho 61-127639 proposes another device capable of eliminating the above-mentioned drawbacks. This device includes a reflector type photosensor for detecting wafers, a light-emitting element, a light-receiving element, and a timing plate located between these elements and having apertures spaced apart at the same intervals are the grooves cut in the wafer carrier. The reflector type photosensor and the light emitting and receiving elements are synchronized to move in the longitudinal direction of the wafer carrier and the timing plate. When an aperture of the timing plate is located between the light emitting and receiving elements, the light receiving element detects light emitted from the light emitting element and a timing signal is outputted responsive to this detection of light. The reflector type photosensor detects light reflected from the wafer and a wafer detection signal corresponding to the detected light is outputted. If the portion of the timing signal corresponding to the time when the light receiving element detects light coincides with the portion of the wafer detection signal corresponding to the time when the photosensor detects light reflected from the wafer, it will be discriminated that the wafer is present in that grooves in the wafer carrier which corresponds to these portions of the timing and wafer detection signals. When they do not coincide with each other, it will be discriminated that no wafer is present in the grooves or that the wafer is not seated rightly in the grooves even when it is present there.

The phase of the timing signal must completely coincide with that of the wafer detection signal in order to enable the device to fulfill its correct detection. It is therefore needed that the timing plate is correctly positioned.

However, positioning error of the timing plate is likely to be caused because the timing plate is mechanically fixed and its apertures are also mechanically formed. Further, the timing plate must be exchanged every time when the pitch of grooves on the wafer carrier changes. It takes a long time for the timing plate to be exchanged with a new one and for the new one to be adjusted upon its being fixed, thereby causing productivity to be lowered.

SUMMARY OF THE INVENTION

The present invention is intended to eliminate the above-mentioned drawbacks.

The object of the present invention is therefore to provide an apparatus, for detecting an array of wafers, having a simple construction and capable of detecting with high accuracy whether or not wafers are rightly mounted on a wafer carrier.

An apparatus for detecting an array of wafers according to the present invention comprises:

reference information generating means for generating reference information from the reference condition in which wafers are arranged on a first wafer carrier;

window setting means for setting wafer-detecting windows at those positions where the wafers are to be arranged on a second wafer carrier, in accordance with the reference information supplied from said reference information generating means;

wafer detecting means for detecting the wafers arranged on the second wafer carrier and generating information representing the presence of the wafers on the second wafer carrier;

signal generating means for generating signal from the information generated by said wafer detecting means; and wafer-position determining means for collating the signals supplied from said signal generating means with said wafer-detecting windows, thereby to detect the shape of that portion of any signal that corresponds to a wafer window, and to determine the position of the wafer from the shape of said portion of the signal.

BRIEF DESCRIPTION OF THE DRAWINGS

FIGS. 2A, 2B, 2C and 2D show signals used to detect wafers mounted on wafer carriers;

FIG. 2E shows time periods corresponding to clock pulses;

FIGS. 2F and 2G show wafer detecting windows;

FIGS. 3A and 3B show total time periods corresponding to signals inputted; and

FIGS. 4A, 4B, 4C, 4D, 4E, 4F and 4G show references on which wafers mounted on wafer carriers are judged.

DETAILED DESCRIPTION OF THE PREFERRED EMBODIMENT

Figure 1:
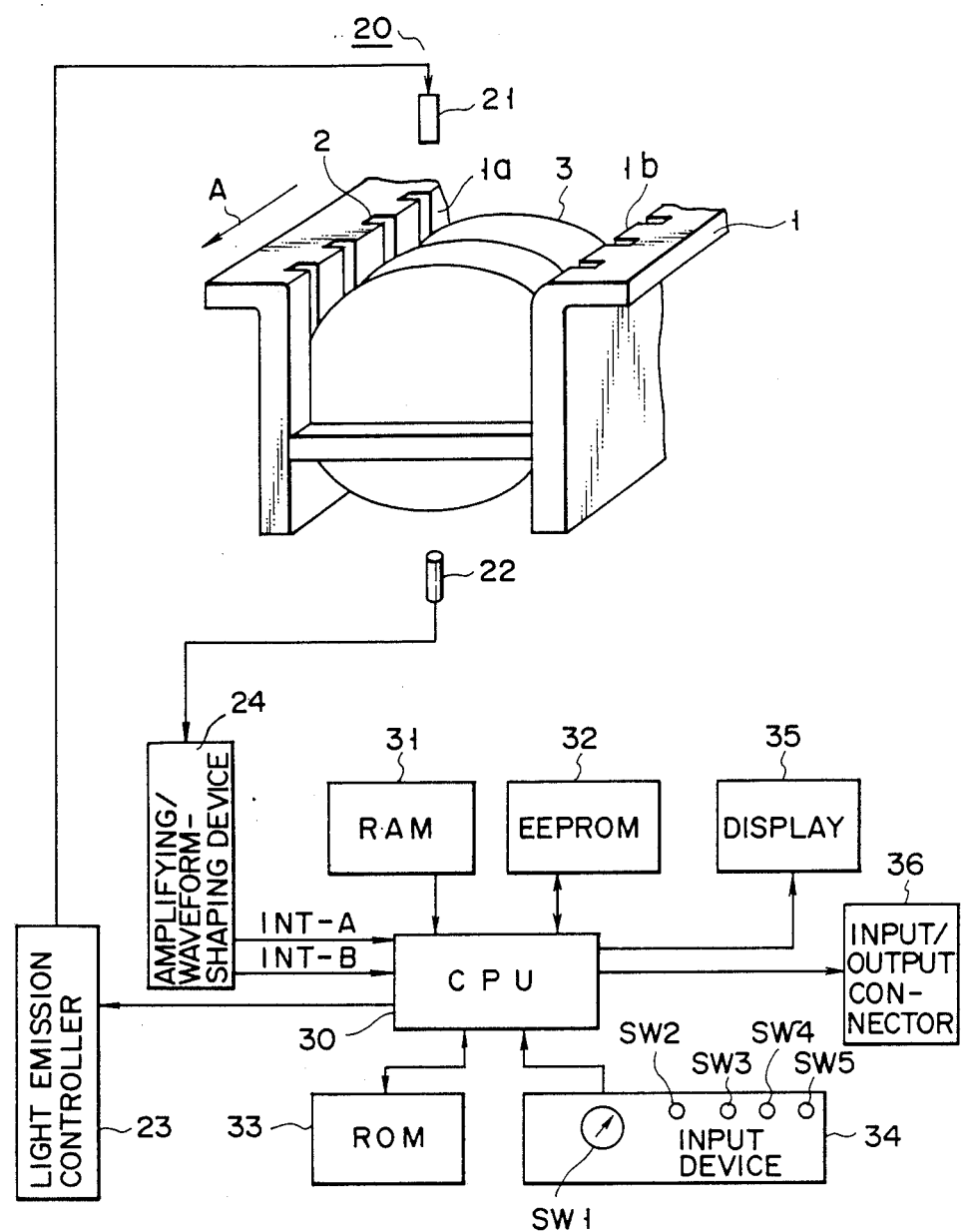
FIG. 1 shows the arrangement of an example of the wafers-array detecting device according to the present invention.

An embodiment of the present invention will be described in detail below with reference of the accompanying drawings.

FIG. 1 shows the arrangement of an example of the wafers detector device according to the present invention. Reference numeral 1 represents a wafer carrier having side plates 1a and 1b. Twenty six grooves 2 are formed in plates 1a and 1b, respectively, at an equal interval along the longitudinal direction of wafer carrier 2. Wafers 3 which are to be detected by the wafers-array detector device are seated in grooves 2. Wafer carrier 1 on which wafers 3 are mounted is carried on a passage formed in a direction shown by arrow A by means of a carrying system (not shown).

Photosensor 20 is intended to detect array of wafers mounted on wafer carrier 1 and it includes light emitting element 21 such as the laser diode and light receiving element 22 such as the phototransistor. Light emitting and receiving elements 21 and 22 are opposed to each other, locating above and below the passage, and carrier 1 is located therebetween.

Light emitting element 21 is connected to light emission controller 23 which is rendered operative in response to instruction applied from CPU (central processing unit) 30. Light emission is controlled by this light emission controller 23.

Light receiving element 22 is intended to receive light emitted by light emitting element 21. When a position of wafer carrier 1, where one of wafers 3 is present, is being passed between light emitting and receiving elements 21 and 22, light emitted by light emitting element 21 is shielded by the wafer. Therefore, the light emitted from light emitting element 21 cannot be received by light receiving element 22. When a position or wafer carrier 1, where no wafer is present, is being passed between light emitting and receiving elements 21 and 22, light emitted by light emitting element 21 is received by receiving element 22. When the light is received, the light signal is converted to an electric signal which represents the array of wafers 3 and which is outputted as a wafer detection signal. This detection signal is inputted to CPU 30 through amplifying and waveform shaping device 2 where the signal is amplified and waveform-shaped.

Further connected to CPU 30 are RAM (random access memory) 31 and EEPROM (electric erasable programmable ROM) 32 for recording data inputted, ROM 33 in which fixed data such as process programs are stored, input device 34, display 35 and input/output connector 36.

Input device 34 comprises switch SW1 for setting the size of a wafer detecting window which will be described later, switch SW2 for testing the operation of the wafers detector device, switch SW3 for causing the system to be re-set, program switch SW4 for causing reference values to be inputted, and switch SW5 for starting the checking of array of wafers.

Display 35 displays the presence or absence of a wafer. In addition, it displays "count busy" representing that wafers 3 are counted, "count error" representing that the reliability of discrimination of the presence or absence of a wafer is low, "hardware error" representing that hardwares are not good with data in EEPROM 32 broken, for example, "power on" representing that CPU 30 is operating, and "sensor error" representing that the light emitting and receiving circuit of photosensor 20 is not good.

Input/output connector 36 comprises with a pin for exchanging data with the wafer processing system, a pin for supplying power, and a pin for inputting and outputting synchro-signal.

A method of application and an operation of above-mentioned apparatus with reference of FIGS. 2A to 4G.

1. Input of Reference Informtion and Setting of Wafer Detecting Windows

Reference-wafer carrier 1 and reference wafers 3 are prepared and these wafers 3 are partly inserted in all grooves 2 correctly on reference-wafer carrier 1.

Wafer carrier 1 is carried along the passage and passed through photosensor 20. When the front and rear end portions of wafer carrier 1 as well as those portions thereof at which wafers 3 are present are passed through between elements 21 and 22, light receiving element 22 receives no light from light emitting element 21, but it receives the light emitted from light emitting element 21 other than the above case. Signal S1 shown in FIG. 2A is thus outputted from light receiving element 22. This signal S1 is amplified and waveform-shaped by amplifying/waveform-shaping device 24. The waveform-shaping of signal S1 is carried out in such a way that rising and falling of signal S1 are detected and that signal S1 is sliced at a certain level. Signal thus amplified and waveform-shaped is inputted to CPU 30 as interrupt signals INT-A and INT-B shown in FIGS. 2B and 2C, respectively.

When interrupt signals INT-A and INT-B are input to CPU 30, CPU 30 starts counting clock pulses having the width equal to the interval between each pulse of signal INT-A and the adjacent pulse of signal INT-B. In other words, CPU 30 starts counting these clock pulses when the first pulse of the INT-A is input to CPU 30, that is, from the time when the front rim of wafer carrier 1 enters the gap between light-emitting element 21 and light-receivng element 22. From the number of clock pulses counted, the reference time TM, i.e., the period between $t_0$ and $t_{54}$ (FIG. 2E), is determined. Input signal S2 shown in FIG. 2D and representing reference time TM is formed and stored as reference information in EEPROM 32.

$SP_O$ of input signal S2 shown in FIG. 2D denotes information on the front end portion of wafer carrier 1, $SP_1$, $SP_2$, ..., $SP_{26}$ thereof information on the first to twenty sixth wafers, respectively, and $SP_{27}$ information on the rear end portion of wafer carrier 1.

Wafer detecting-windows WIA and WIB shown in FIGS. 2F and 2G are formed on the basis of input signal S2 stored as reference information in EEPROM 32. The wafer-detecting windows are set in order to use only input information corresponding to them for discriminating whether or not wafers are mounted on the wafer carrier and whether or not count error is present. Therefore, portions of signal not corresponding to the windows are not used for these discriminations.

This wafer detecting window can be set to have a certain width by operating switch SW1 of input means 34. WIA represents wafer detecting windows A1, A2, ... each having a width of 100%, taking each wafer information $SP_1$, $SP_2$, ... as its center, while WIB represents wafer detecting windows B1, B2, ... each having a width of 50%, taking each wafer information $SP_1$, $SP_2$, ... as its center.

The width of the wafer detecting window can be changed by softwares and any desired width can be selected for wafer detecting windows by using dip rotary switch and the like.

2. Wafers Detecting Operation

After reference information is inputted and wafer detecting windows are set, as described above, wafer carrier 1 on which wafers 3 to be subjected to the film depositing process and the others are mounted is carried along the passage. When wafer carrier 1 is thus passed between light emitting and receiving elements 21 and 22 of photosensor 20, the presence of the front end of wafer carrier 1, the presence of wafers 3 mounted on wafer carrier 1, and the presence of the rear end of wafer carrier 1 are successively detected by light receiving element 22 and signal S1' which represents wafers 3 mounted on wafer carrier 1 is thus obtained, similarly to the above-described case of inputting reference information. Similarly to the case of signal S1 signal S1' is amplified and waveform-shaped, detecting its rising portion and falling portion, and interrupt signals INT-A' and INT-B' thus obtained are inputted to CPU 30. Time TM' are measured and input signal S2' is thus formed, similarly to the case of reference information. This input signal S2' is once stored, as wafer detection signal, in RAM 31.

The total time period of this signal S2' is compared with that of input signal S2 to obtain the ratio of these signals. Providing that the total time period of signal S2 inputted as reference information is TA as shown in FIG. 3A and that the total time period of signal S2' is TB, for example, TB/TA is calculated. Times $t_0$, $t_1$, ... of input signal S2' are corrected on the basis of this ratio TB/T thus obtained to form signal S2''. It is discriminated by CPU 30 whether or not wafers 3 are mounted on wafer carrier 1 using the wafers detecting windows each having the predetermined width. This discrimination is carried out, as shown in FIGS. 4A-4G, according to the shapes of input signal S2'.

FIGS. 4A to 4G show the shapes of the signals detected in wafer detecting windows having the same width of 50% as the windows WIB, and explain how to determine whether or not a wafer is mounted at a specific position on the wafer carrier and whether or not a wafer, if any at that position is correctly positioned, in accordance with the shapes of the signals;

FIG. 4A shows only one wafer detection pulse SP present in window WI. It is discriminated in this case that the wafer is correctly inserted in its corresponding grooves formed in the wafer carrier.

FIG. 4B shows pulse SP' present along with signal which can be regarded as the wafer detection pulse in window WI. It is discriminated in this case that the wafer is present but that count error is present because the reliability in detecting the wafer is low.

FIG. 4C shows that a falling portion is present in window WI, that the low level portion of signal is present more than 50% of the window width, and that wafer detection pulse completely shaped is not included in window WI. It is discriminated in this case that the wafer is present but that count error is present because the reliability in detecting the wafer is low.

FIG. 4D shows that a rising portion is present in window WI, that the low level portion of signal is present less than 50% of the window width, and that no wafer detection pulse completely shaped is included in window WI. It is discriminated in this case that no wafer is present and that count error is present because the reliability in detecting the wafer is low.

FIG. 4E shows linear signal having only high level portion and no change in level present in window WI. It is discriminated in this case that no wafer is present in its corresponding grooves.

FIG. 4F shows linear signal having only low level portion and no change in level present in window WI. It is discriminated in this case that the wafer is present in its corresponding groove but that count error is present because the reliability in detecting the wafer is low.

FIG. 4G shows wafer detection pulse SP and a failing portion present in window WI. It is discriminated in this case that the wafer is present but that count error is present because the reliability in detecting the wafer is low.

When the wafers detecting operation is finished, it is displayed on display 35 the presence or absence of a wafer, and count error is also displayed on it when count error is present.

The error message displayed by display 35 represents that the reliability in detecting the wafer is low and that the wafer is not correctly seated in its corresponding grooves. When operator sees this error display on display means 35, therefore, he must confirm whether or not the wafer is present or correctly seated in its corresponding grooves. That is, in the case shown in FIGS. 4B and 4G, the possibility exists that two pieces of wafers are inserted in one pair of grooves and in the cases shown in FIGS. 4C, 4D and 4F, the possibility exists that the wafer is not correctly inserted in grooves or the wafer is fallen.

When it is intended only to count the number of wafers, operator checks up the wafers mounted on the wafer carrier which are under detection according to error displays and then again starts the wafers counting operation.

Information of an array of wafers on the wafer carriers is outputted to the wafers process means and the others through input/output connector 36.

According to the above-described embodiment of the present invention, the wafer-detecting windows which correspond to timing signals can be electronically set by softwares and it can be detected in these windows whether or not wafers are present or correctly inserted in their respective grooves on the wafer carrier. This makes it unnecessary to use the conventional timing plate. It is not needed therefore that the timing plate is positioned with high accuracy, thereby making it easier to adjust and set the wafers-array detecting apparatus.

Further, the setting of the wafer detecting windows is electronically conducted by softwares, as described above. Therefore, even when the pitch of wafers in their respective grooves formed in the wafer carrier or the speed of carrying the wafer carriers is changed, the width of the wafer-detecting windows can be more easily changed to match the new pitch or speed, thereby preventing the operation rate of the apparatus from being lowered.

Furthermore, the state of each wafers is discriminated according to the shapes of input signal, i.e. wafer detection signal in the wafer detecting windows. Therefore, this enables to be discriminated whether or not, in array of the wafers is suitable with high accuracy.

It should be understood that the present invention is not limited to the above-described embodiment but that various changes and modifications can be made without departing the spirit and scope of the present invention. Although the photosensor has been fixed and wafer carriers have been moved relative to this fixed photosensor in the above-described embodiment, the sensor may be arranged movable or both of the photosensor and wafer carrier may be arranged movable. In short, both of them may be moved relative to each other.

What is claimed is:

1. An apparatus for detecting an array of wafers, comprising:
    reference information generating means for generating reference information from the reference condition in which wafers are arranged on a first wafer carrier;
    window setting means for setting wafer-detecting windows at those positions where the wafers are to be arranged on a second wafer carrier, in accordance with the reference information supplied from said reference information generating means;
    wafer detecting means for detecting the wafers arranged on the second wafer carrier and generating information representing the presence of the wafers on the second wafer carrier;
    signal generating means for generating signals from the information generated by said wafer detecting means; and
    wafer-position determining means for collating the signals supplied from said signal generating means with said wafer-detecting windows, thereby to detect the shape of that portion of any signal that corresponds to a wafer window, and to determine the position of the wafer from the shape of said portion of the signal.

2. The apparatus according to claim 1, wherein plural grooves in which the wafers are seated are formed on the wafer carrier and reference state of the wafers is established when the wafers are seated in all of the grooves on the wafer carrier.

3. The apparatus according to claim 1, wherein said reference information forming means includes a means for detecting the wafers which are under reference state, and a means for forming a reference wafer detection signal on the basis of information detected by the reference wafers detecting means.

4. The apparatus according to claim 3, wherein said reference wafers detecting means includes a photosensor.

5. The apparatus according to claim 3, wherein said reference signal forming means includes signal-amplifying and signal-waveform-shaping means.

6. The apparatus according to claim 1, wherein said wafer windows setting means includes a means for setting the size of the wafer detecting windows.

7. The apparatus according to claim 1, wherein said wafers detecting means includes a photosensor.

8. The apparatus according to claim 7, wherein said photosensor includes a light emitting element and an element for receiving light emitted from the light emitting element.

9. The apparatus according to claim 1, wherein said means includes a means for whether or not the wafers are correctly seated in their respective grooves on the wafer carrier.

10. The apparatus according to claim 1, further comprising reference information-storing means for storing the reference information.

11. The apparatus according to claim 1, further comprising detection signal storing means for storing the wafer detection signal.

* * * * *